(12) United States Patent
Morita et al.

(10) Patent No.: US 6,202,890 B1
(45) Date of Patent: Mar. 20, 2001

(54) PARTS FEEDER

(75) Inventors: Manabu Morita, Neyagawa; Takeshi Nishiguchi, Sourku-gun; Mikio Yasuda, Ichinomiya, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/353,634

(22) Filed: Jul. 15, 1999

(30) Foreign Application Priority Data

Jul. 15, 1998 (JP) .................................................. 10-200001
Mar. 31, 1999 (JP) .................................................. 11-092574

(51) Int. Cl.$^7$ ...................................................... G07F 11/00
(52) U.S. Cl. ............................................. 221/87; 221/277
(58) Field of Search .............................. 221/87, 88, 82, 221/76, 277, 258, 197; 198/347.1

(56) References Cited

U.S. PATENT DOCUMENTS 5,431,301 * 7/1995 Suzuki et al. ........................ 221/277

FOREIGN PATENT DOCUMENTS

| | | |
|---|---|---|
| 2833424 | 2/1980 | (DE) . |
| 0805620 A2 | 11/1997 | (EP) . |
| 1141571 | 1/1969 | (GB) . |
| 62280115 | 5/1987 | (JP) . |

* cited by examiner

Primary Examiner—Kenneth W. Noland
(74) Attorney, Agent, or Firm—Louis Woo

(57) ABSTRACT

A parts feeder is provided which may be employed in feeding electronic parts such as chip components to a mounting device for mounting them on a printed circuit board, for example. The parts feeder is designed to lift up parts supplied from an inlet to a parts orientation chamber to an outlet along an inner peripheral surface of the parts orientation chamber using a magnetic mechanism. A parts orienting path is defined upstream of the outlet which allows only the parts oriented in given directions to pass therethrough. A guide member is disposed within the parts orientation chamber to guide the parts, which are unoriented in alignment with a parts transport path connecting the outlet and a parts pickup station and which are dropped from the outlet, to an inlet for facilitating transportation of the parts by the magnetic mechanism to the parts orienting path, thereby avoiding jamming of the parts in the parts orienting path.

37 Claims, 10 Drawing Sheets

PARTS FEEDER

BACKGROUND OF THE INVENTION

1. Technical Field of the Invention

The present invention relates generally to an improved structure of a parts feeder which may be employed in feeding electronic parts such as chip components to a mounting device for mounting them on a printed circuit board, for example.

2. Background Art

Parts feeders are known which are designed to lift up parts supplied to a parts orientation chamber to an outlet along an inner peripheral surface of the parts orientation chamber using a magnetic mechanism. A parts orienting path is defined upstream of the outlet which allows only the parts oriented in given directions to pass therethrough. Only the parts oriented in alignment with a transport path leading to the outlet when arriving at the outlet are allowed ultimately to enter the transport path through the outlet, while the others are dropped on the bottom of the parts orientation chamber without entering the transport path. The drawback may, therefore, be encountered in that the dropping parts are accumulated on the bottom of the parts orientation chamber, thereby blocking the parts orienting path.

SUMMARY OF THE INVENTION

It is therefore a principal object of the present invention to avoid the disadvantages of the prior art.

It is another object of the present invention to provide a parts feeder designed to supply parts to a parts pickup station in sequence in a desired orientation.

According to one aspect of the invention, there is provided a parts feeder feeding parts in sequence in a desired orientation. The parts feeder includes: (a) a base; (b) a parts storage disposed on the base, storing therein a plurality of parts; (c) a parts orientation chamber formed in the base, the parts orientation chamber having a parts inlet and a parts outlet, the parts inlet leading to the parts storage so that the parts within the parts storage are supplied to the parts orientation chamber through the parts inlet, the parts outlet being formed in an upper portion of the parts orientation chamber and leading to a parts pickup station through a transport path; (d) a parts lining up path extending from a lower portion of the orientation chamber to the parts outlet, the parts lining up path being designed to allow the parts oriented in a given direction to pass through the parts lining up path; (e) a parts lifting mechanism lifting the parts supplied to the orientation chamber through the parts inlet toward the parts outlet through the parts lining up path; and (f) a guide member disposed within the parts orientation chamber, the guide member having a parts guiding surface which extends between an upper end of the parts lining up path leading to the parts outlet and the parts inlet for guiding the parts dropping from the parts lining up path without entering the parts outlet toward the parts inlet.

In the preferred mode of the invention, the parts guiding surface of the guide member has a lower end located at a given interval away from the parts inlet.

The given interval is greater than a length of the parts.

The parts orientation chamber is a cylindrical chamber having an inner circumferential wall. The parts outlet is formed in an upper portion of the inner circumferential wall. The parts inlet is formed in a lower portion of the inner circumferential wall.

The parts lifting mechanism has a plurality of magnets arranged on a given circular line substantially coinciding with the inner circumferential wall of the parts orientation chamber. The parts lifting mechanism turns the magnets along the circular line to transport the parts magnetically toward the parts outlet along the inner circumferential wall through the parts lining up path.

Each of the magnets produces a magnetic force attracting one of the parts lying within a given range on the inner circumferential wall. The given interval between the lower end of the parts guiding surface of the parts guide member and the parts inlet may fall within the given range.

The magnets are each made of a magnetic disc having a preselected radius and arranged at centers thereof on the circular line. The given interval between the lower end of the parts guiding surface of the guide member and the parts inlet may be smaller than the radius of the magnets.

The parts lifting mechanism has a rotary disc having an end surface on which the magnets are arranged at regular intervals on the given circular line. The rotary disc is rotated to move the magnets along the given circular line so that each of the magnets may produce a magnetic force at least between the parts inlet and the lower end of the parts guiding surface of the guide member when each of the magnets travels near the parts inlet.

The center of the given circular line on which the magnets are arranged may be shifted upward from that of the inner circumferential wall of the parts orientation chamber for urging the parts magnetically against the inner circumferential wall as the parts advance upward.

The parts guiding surface of the guide member is mirror finished. The parts guiding surface has an upper end connecting to an upper inner wall of the parts orientation chamber upstream of the parts outlet.

The width of the guide member is substantially equal to that of the parts orientation chamber.

A parts orienting member is disposed between the guide member and an inner wall of the parts orientation chamber. The parts orienting member has a parts orienting surface to define the parts lining up path between the parts orienting surface and the inner wall of the parts orientation chamber.

A lower end of the parts guiding surface of the guide member is located below the parts orienting member.

The parts orienting member is formed integrally with the guide member.

At least the lower end portion of the guide member is made of a strip member.

The parts guiding surface of the guide member extends straight to the parts inlet.

The parts outlet is made of a material harder than that of the parts orientation chamber.

The transport path is greater in sectional area than the parts outlet.

The transport path includes an upstream portion which leads to the parts outlet and which is curved along the given circular line on which the magnets are arranged.

The upstream portion of the transport path extends downward from the parts outlet.

A parts drawing mechanism is provided which draws the parts entering the parts outlet to the parts pickup station through the transport path.

A pickup nozzle is provided which picks up one of the parts transported to the parts pickup station. The parts drawing mechanism stops drawing the parts when the pickup nozzle picks up one of the parts.

The base has a given length. The transport path extends in a lengthwise direction of the base to one end of the base. A parts drawing force is supplied from the other end of the base to the parts drawing mechanism.

The parts drawing mechanism draws a vacuum from the transport path.

The guide member may be made of a non-magnetic conductive material.

According to another aspect of the invention, there is provided a parts feeder feeding parts in sequence in a desired orientation. The parts feeder comprises: (a) a base; (b) a parts orientation chamber defined in the base by a first side wall, a second side wall opposite the first side wall, a third side wall, a fourth side wall opposite the third side wall between the first and second side walls, an upper wall, and a lower wall, the parts orientation chamber having a parts inlet and a parts outlet, the parts outlet being formed in the upper wall of the parts orientation chamber and leading to a parts pickup station through a transport path; (c) a parts lining up path defined within the parts orientation chamber which extends from at least the third side wall to the parts outlet so that the parts oriented in a given direction may pass through the parts lining up path; (d) a parts lifting mechanism moving at least one magnet along a given travel path to attract and lift the parts supplied to the orientation chamber through the parts inlet upward from at least the lower wall to the parts lining path; (e) a parts orienting member disposed within the parts orientation chamber on the first side wall, the parts orienting member having a parts orienting side wall which defines the parts lining up path between itself and at least the third side wall and the upper wall of the parts orientation chamber; and (f) an unoriented parts releasing mechanism provided at an inlet of the parts lining up path to release the parts unoriented in the given direction from attraction to the magnet of the parts lifting mechanism.

In the preferred mode of the invention, a guide member is disposed within the parts orientation chamber. The guide member has a parts guiding surface which extends between an upper end of the parts lining up path and the parts inlet for guiding the parts dropping from the parts lining up path without entering the parts outlet toward the parts inlet.

The lower wall and the third side wall are formed with a curved wall.

The parts lifting mechanism has a plurality of magnets arranged on a given circular line partially coinciding with the parts lining up path. The parts lifting mechanism turns the magnets along the circular line to transport the parts magnetically toward the parts outlet through the parts lining up path.

The parts lifting mechanism has a rotary disc having an end surface on which the magnets are arranged at regular intervals on the given circular line. The rotary disc is rotated to move the magnets along the given circular line.

The parts orienting side wall of the parts orienting member is tapered away from the first side wall of the parts orientation chamber. The unoriented parts releasing mechanism is formed with a second side wall which continues from the parts orienting side wall of the parts orienting member and which is tapered away from the first side wall of the parts orientation chamber.

The lower wall and the third side wall is formed with a wall curved along the circular line on which the magnets are arranged.

The transport path includes an upstream portion which leads to the parts outlet and which is curved along the given circular line on which the magnets are arranged.

The parts outlet is designed to prohibit entrance of the parts unoriented in the given direction.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1:
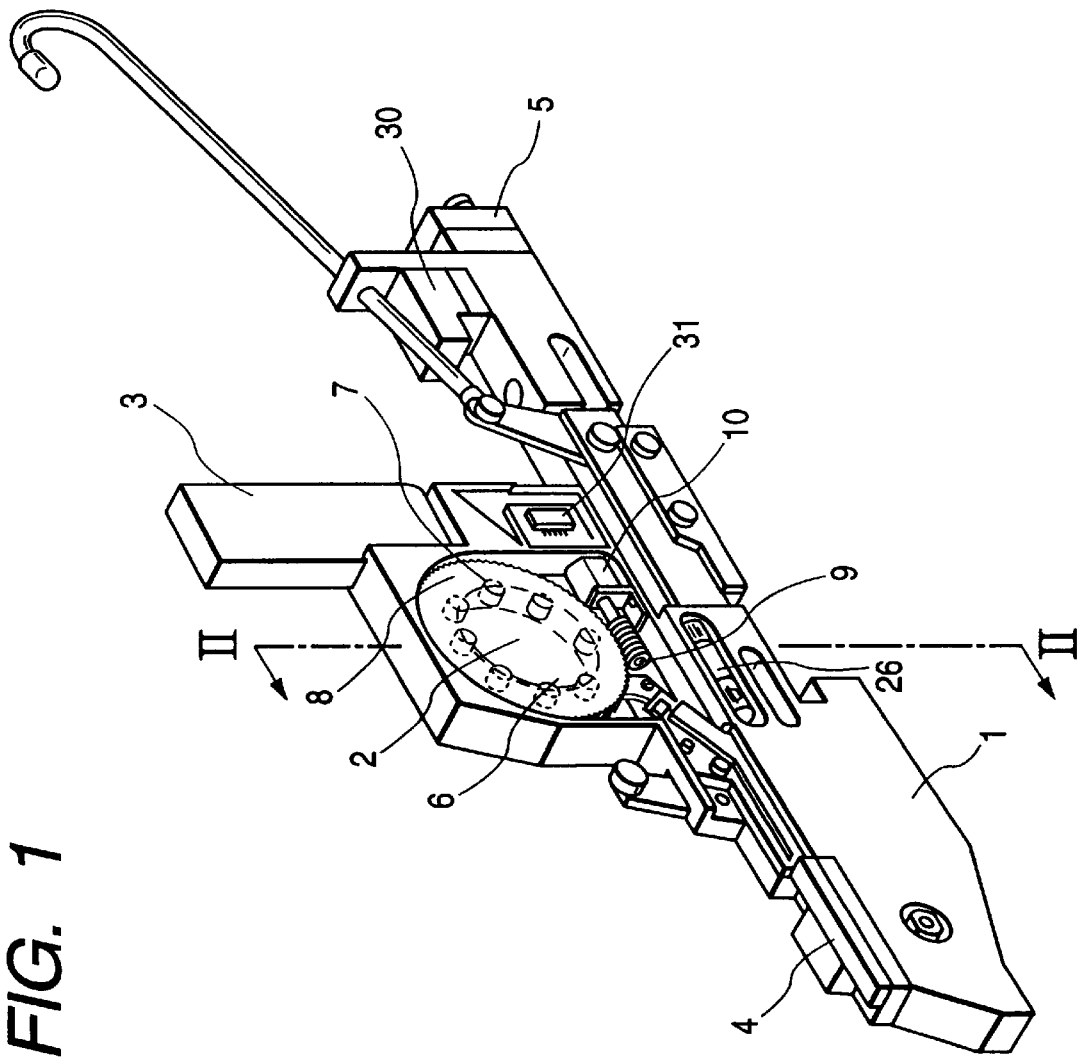
FIG. 1 is a perspective view which shows a parts feeder according to the first embodiment of the invention.
Figure 2:
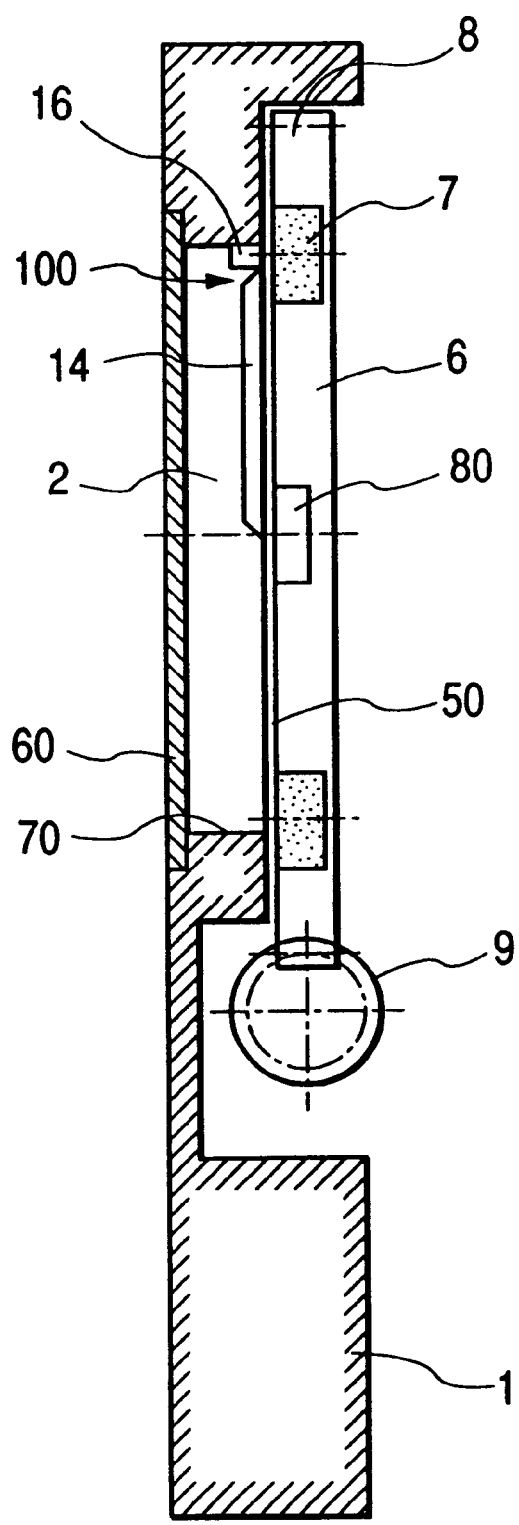
FIG. 2 is a vertical sectional view taken long the line II—II in FIG. 1.
Figure 3:
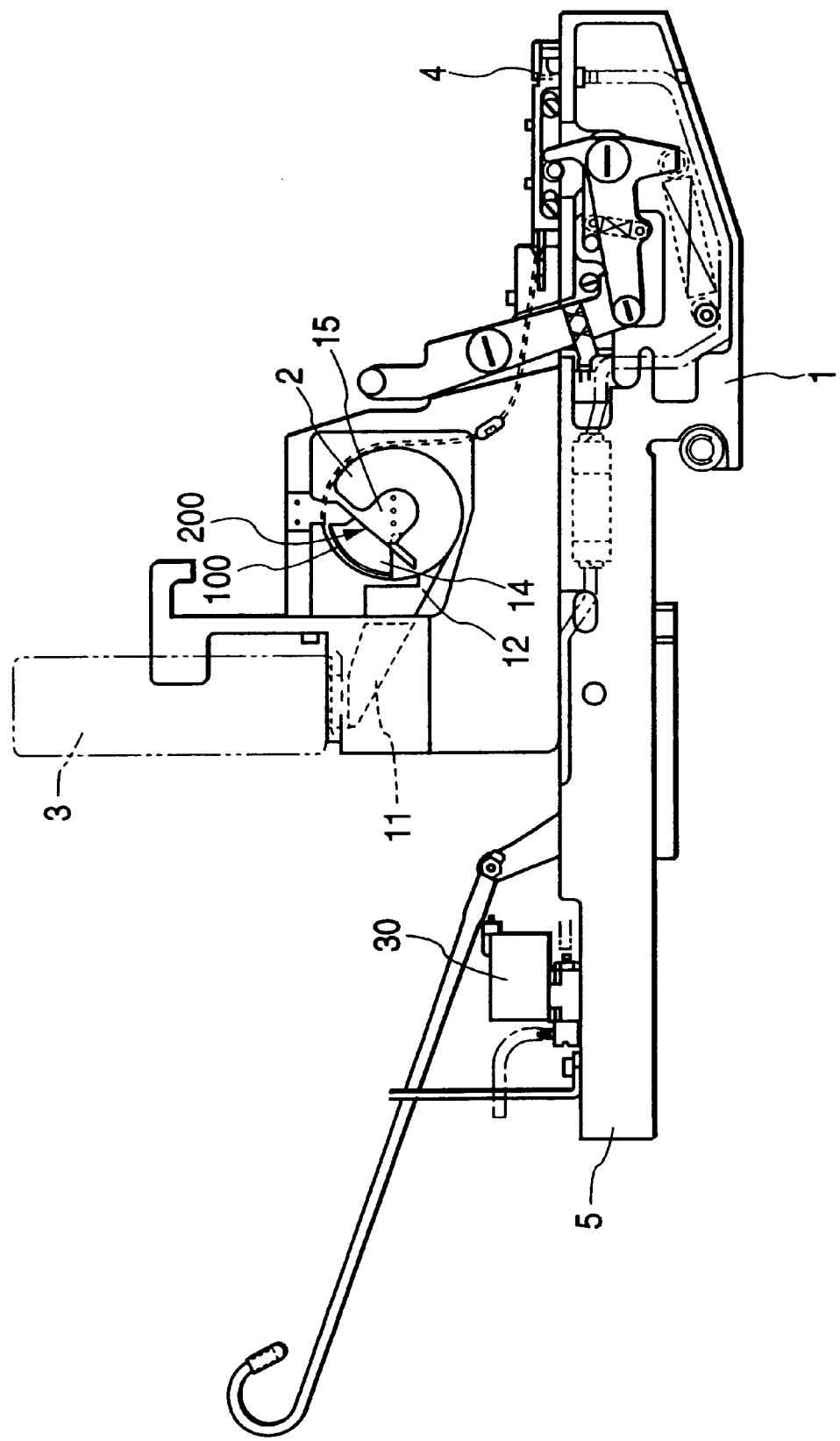
FIG. 3 is a side view which shows a side of a parts feeder opposite the one shown in FIG. 1.

Referring now to the drawings, wherein like numbers refer to like parts in several views, particularly to FIGS. 1 to 3, there is shown a parts feeder according to the present invention which may be employed in feeding electronic parts such as chip components to a mounting device for mounting them on a printed circuit board, for example.

The parts feeder includes generally a base 1 made of aluminum (i.e., a non-magnetic conductive material) by die casting, a hollow cylindrical parts orientation chamber 2, a parts cassette 3, and a rotary disc 6. The parts orientation chamber 2 is formed in a central upper portion of the base 1, as viewed in the drawing. An outlet path 4 is formed in a front end portion of the base 1. A connector 5 is attached to a rear end of the base 1. The parts cassette 3 storing therein a plurality of parts is mounted adjacent the parts orientation chamber 2. The parts orientation chamber 2 is, as clearly shown in a sectional view of FIG. 2, closed at one end by a resinous cover 60 transparent for observation of an operator and at the other end by a phosphor bronze-made cover 50.

The cover 50 may alternatively be made of another nonmagnetic material such as aluminum or stainless steel. On the cover 50, a rotary disc 6 is installed detachably through a support shaft 80. The rotary disc 6 is made of resin and has, as shown in FIGS. 2 and 4, a plurality of disc magnets 7 embedded at regular interval in a side surface thereof along a circular line which has substantially the same radius of curvature as that of an inner peripheral wall 70 of the parts orientation chamber 2 and whose center is shifted upward, as will be discussed later in detail, by a given distance from the center of the inner peripheral wall 70 of the parts orientation chamber 2.

A gear 8 is formed on the periphery of the rotary disc 6 which meshes with a drive gear 9 (i.e., a worm) connected to an output shaft of an electric motor 10.

Figure 4:
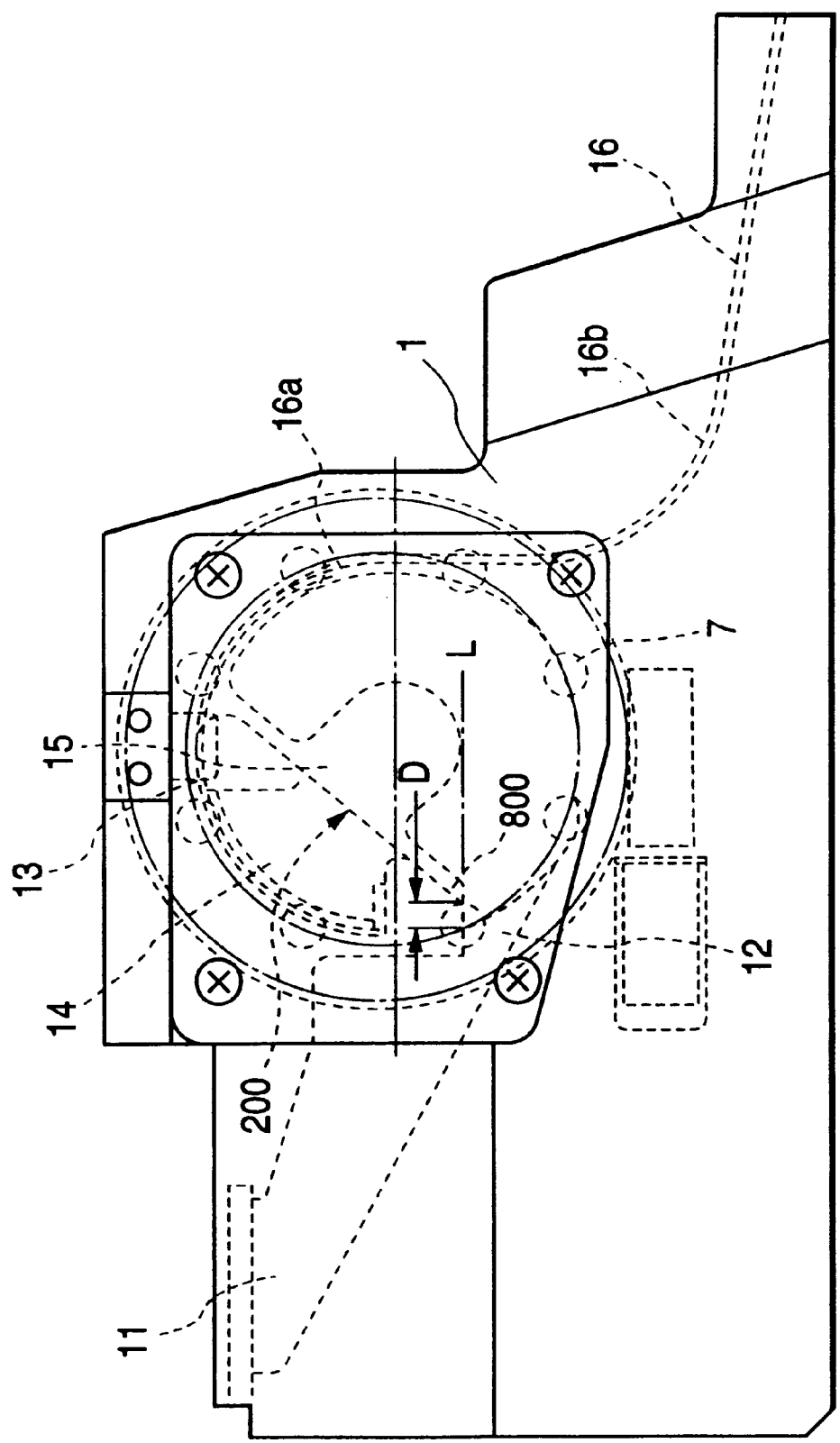
FIG. 4 is a partially enlarged view which shows a parts orientation chamber.

A parts supply path 11 is, as clearly shown in FIGS. 3 and 4, formed in the base 1 which communicates with an outlet formed in the bottom of the parts cassette 3 and an inlet 12 of the parts orientation chamber 2 to supply the parts from the parts cassette 3 into the parts orientation chamber 2.

The rotary disc 6 is rotated by the electric motor 10 through the gears 8 and 9 to circle the magnets 7 along a given travel path (i.e., the circular line on which the centers of the magnets 7 are arranged). The magnets 7 magnetically attract the parts entering the parts orientation chamber 2 and lift them upwards along the inner peripheral wall 70 of the parts orientation chamber 2. The magnets 7 are, as described above, arranged along the circular line whose center is shifted slightly upwards from that of the inner peripheral wall 70 of the parts orientation chamber 2. The circular movement of the magnets 7, thus, causes the parts to be urged against the inner peripheral wall 70 of the parts orientation chamber 2 strongly as they advance upward, thereby holding the parts firmly on the inner peripheral wall 70 of the parts orientation chamber 2. The circular line may alternatively coincide with the inner peripheral wall 70 of the parts orientation chamber 2.

Figure 5:
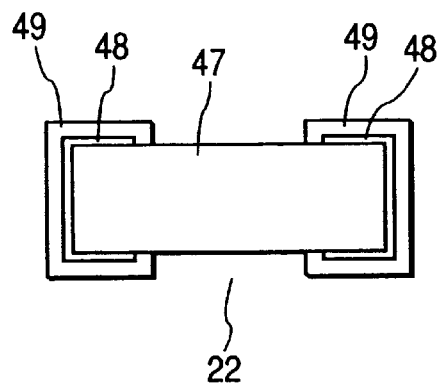
FIG. 5 is an illustration which shows one example of parts handled by a parts feeder.

Usually, parts feeders of the type in this embodiment handle electronic parts such as chip resistors. FIG. 5 illustrates one example of such chip resistors. The chip resistor 22 has nickel electrode layers 48 plated on ends of a strip substrate 47 and solder-plated layers 49 formed on the electrode layers 48. The chip resistor 22 is attracted at the electrode layers 48 to one of the magnets 7 and then lifted upwards along the inner peripheral wall 70 of the parts orientation chamber 2.

A parts orienting member 14 formed integrally with the base 1 is, as will be described later in detail, disposed between the inlet 12 and an upper outlet 13 in contact with the cover 50. The parts orienting member 14 is, as clearly shown in FIGS. 2, 4, and 6, made of a fan-shaped member which corresponds to a quarter (90°) of a disc and which has an arc side wall defining a parts lining up path 100 between itself and the inner peripheral wall 70 of the parts orientation chamber 2 for transporting, one by one, the parts oriented in given directions to the outlet 13. The sectional area of the parts lining up path 100 is so determined as to prevent the parts lifted up by the magnets 7 from being jammed thereinto. If the parts being transported along the parts lining up path 100 are not oriented in a desired direction, that is, if the length of each part is out of alignment with the outlet 13, it may cause the part to drop from the parts lining up path 100 upon disappearance of the magnetic force of the magnets 7 when passing through the outlet 13.

A guide 15 which is integrally formed with the base 1 by die casting is, as shown in FIGS. 3, 4, 6, and 7, arranged at the center of the parts orientation chamber 2. The guide 15 has a flat mirror finished surface 200 inclined downward so that the parts dropping from the parts lining up path 100 may slide down the surface 200 to the bottom of the parts orientation chamber 2. The mirror finished surface 200, as clearly shown in FIG. 4, connects at an upper end thereof to an upper portion of the inner peripheral wall 70 of the parts orientation chamber 2 for avoiding jamming of the parts therebetween and extends straight from an upstream side of the outlet 13 toward an upper portion of the inlet 12. The mirror finished surface 200 also connects at both sides thereof to the covers 50 and 60 so that all the parts falling on the surface 200 slide to the lower end 800 thereof. The lower end 800 of the surface 200 may alternatively be located below the inlet 12. The lower end 800 of the surface 200 is separated at an interval D away from the inlet 12 which allows the parts to drop without being caught between the lower end 800 and the inlet 12. It is, thus, advisable that the interval D be longer than the length of the parts. The center of each of the magnets 7, as described above, moves along the travel path substantially coincident with the inner peripheral wall 70 of the parts orientation chamber 2. Each of the magnets 7 preferably attracts one of the parts when passing through the lower end 800 of the surface 200 and the inlet 12 and transports it through the bottom of the parts orientation chamber 2 to the parts lining up path 100 again. It is, thus, also advisable that the interval D be less than or equal to the radius of the magnets 7 so that the magnetic force enough to transport one of the parts along the inner peripheral wall 70 of the parts orientation chamber 2 to the parts lining up path 100 can act on each of the parts dropping to the lower end 800 of the surface 200. This enables the parts supplied from the inlet 12 to be transported, in sequence, into the parts lining up path 100 cyclically. Therefore, the parts supplied from the inlet 12 are transported to the parts lining up path 100 successively without being accumulated above the line L extending through the upper portion of the inlet 12 (i.e., the lower end 800 of the surface 200), that is, without blocking the parts lining up path 100.

Figure 6:
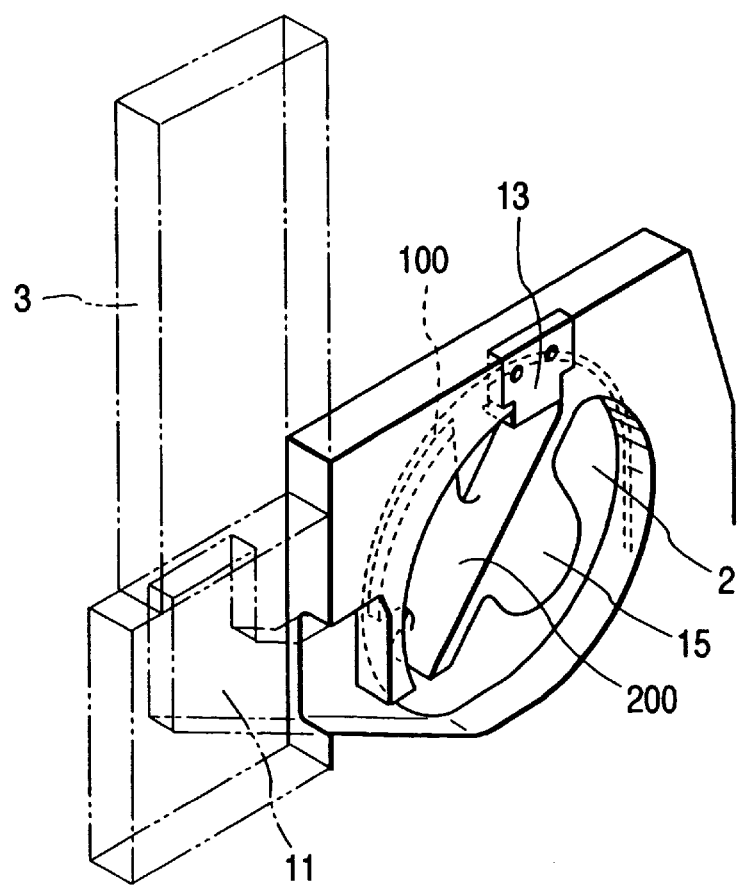
FIG. 6 is a partially perspective view which shows a parts orientation chamber.
Figure 7:
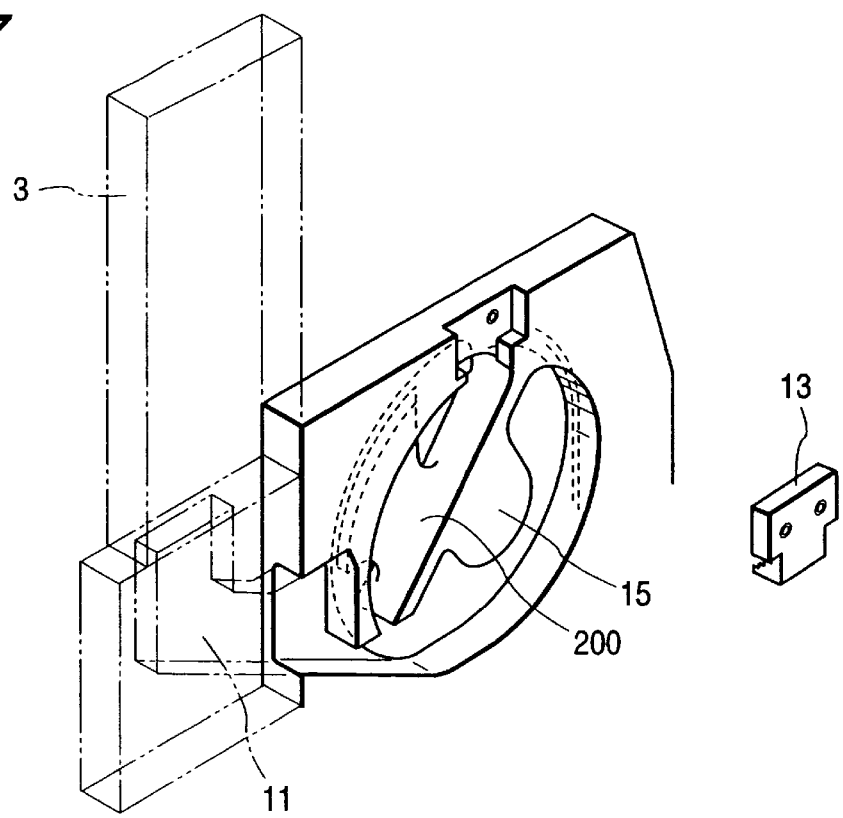
FIG. 7 is a partially perspective view which shows a parts orientation chamber from which an outlet is removed.

A transport path 16, as shown in FIGS. 3 and 4, is formed in the base 1 which extends from the outlet 13 to the outlet path 4. The formation of the transport path 16 is achieved by making a cut along a side wall of the base 1. The parts lifted up by the magnets 7 along the parts lining up path 100 in a desired orientation enter the transport path 16 at the outlet 13. The transport path 16 has, as clearly shown in FIG. 4, an upstream portion 16a curved along the travel path of the magnets 7 and a sloping portion 16b leading to the outlet path 4. The parts entering the transport path 16 at the outlet 13 are, thus, moved along the upstream portion 16a while they are attracted by the magnets 7. The outlet 13 has an open area which is required for the oriented parts to be transferred in sequence into the transport path 16. The transport path 16 has a sectional area which is greater than the open area of the outlet 13 for preventing the parts from being caught in the transport path 16. In order to minimize the wear caused by collision of the unoriented parts, the outlet 13 is, as shown in FIGS. 6 and 7, formed with a stainless steel member harder than the parts orientation chamber 2 and is installed on the base 1 by screws (not shown).

Figure 8:
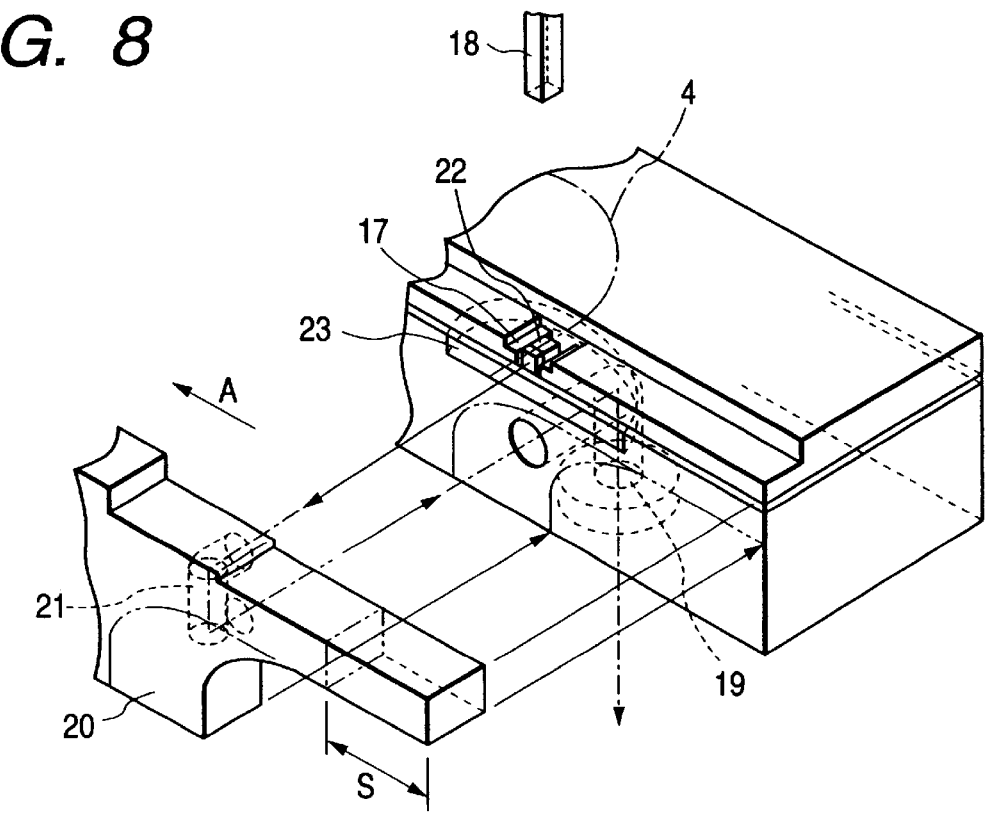
FIG. 8 is a partially perspective view which shows a parts pickup station.

A pickup station 17 is, as shown in FIG. 8, provided at a downstream end of the outlet path 4. At the pickup station 17, the parts are picked up cyclically by a vacuum nozzle 18. A vacuum pipe 19 is installed beneath the outlet path 4 which communicates with a connection pipe 21 installed in a slider 20. The connection pipe 21 opens into the outlet path 4 to draw the parts entering the transport path 16 to the pickup station 17. The slider 20 is installed on the base 1 so as to slide in a direction A, as indicated in FIG. 8. When it is required to draw the parts to the pickup station 17, that is, when the parts feeder is turned on, the slider 20 is first kept at an illustrated location to establish communication between the connection pipe 21 and the outlet path 4. After a preselected period of time enough for one of the parts, as denoted by numeral 22, to arrive at the pickup station 17, the slider 20 is moved in the direction A by a distance S to block the communication between the connection pipe 21 and the outlet path 4, stopping the drawing of the part 22. Subsequently, the vacuum nozzle 18 is moved downward to pickup the part 22 from the pickup station. These sequential operations are automatically performed in a cycle.

A buffer 23 (e.g., a rubber) is disposed beneath the pickup station 17 to absorb the impact exerted on the part 22 by the vacuum nozzle 18, thereby avoiding damage to the part 22.

Figure 9:
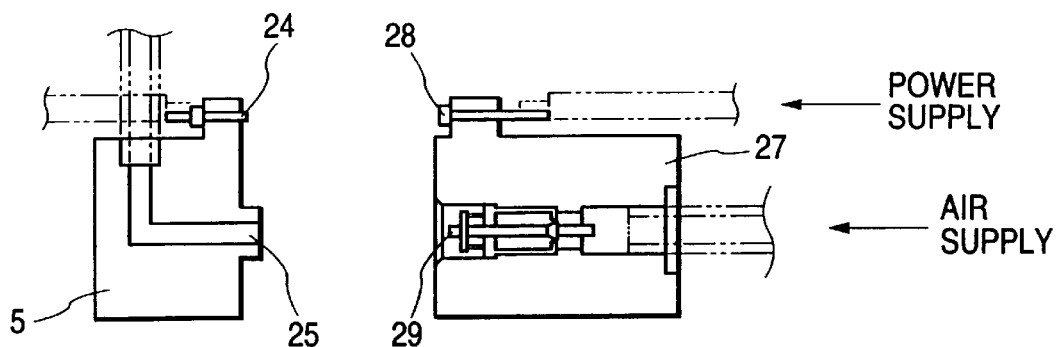
FIG. 9 is an illustration which shows a connector for supplying an air pressure for picking up parts and electric power to a parts feeders.
Figure 10:
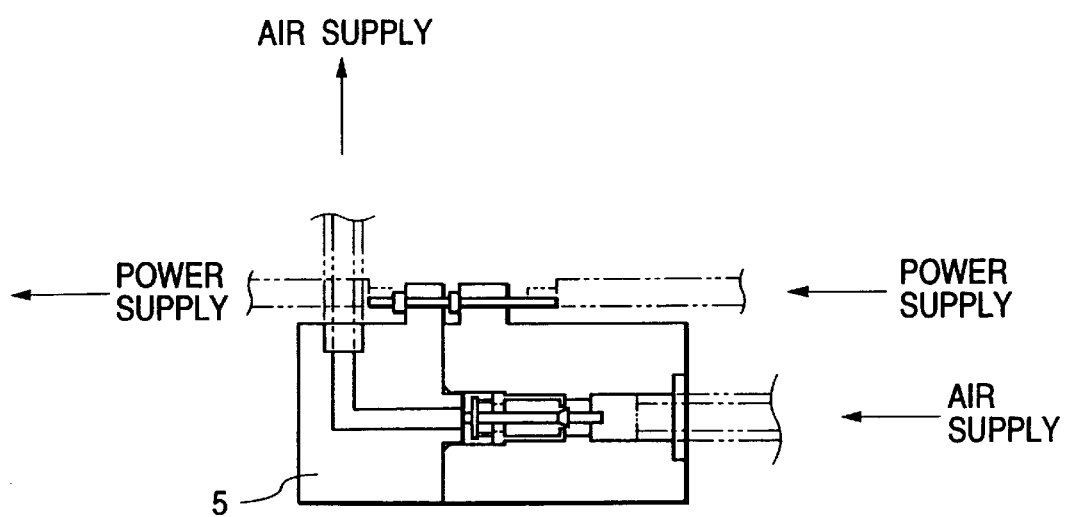
FIG. 10 is an illustration which shows the connector, as shown in FIG. 9, attached to an end of a parts feeder.

The connector 5 has, as clearly shown in FIG. 9, an electric connector 24 and an air connector 25. The electric connector 24, as shown in FIG. 10, connects with a power supply terminal 28 of a connector 27 and supplies the power to the motor 10 for tuning the rotary disc 6. The air connector 25 connects at one end with an air connector 29 of the connector 27 and at the other end with the vacuum pipe 19 through a vacuum converter 26, as shown in FIG. 1. The air connector 29 connects with an air pump (not shown) to supply a positive air pressure to the vacuum converter 26. The vacuum converter 26 transforms the positive air pressure into a negative air pressure, i.e., a vacuum. Instead of the vacuum converter 26, the vacuum pipe 19 may be connected directly to a vacuum pump (not shown) through the connector 27.

A solenoid valve 30, as shown in FIG. 1, is installed near the connector 5. The solenoid valve 30 is operated by a control circuit 31 to selectively open and close an air passage extending between the air connector 25 and the vacuum converter 26 for saving the vacuum power when it is not required to deliver the parts from the parts feeder.

Figure 11:
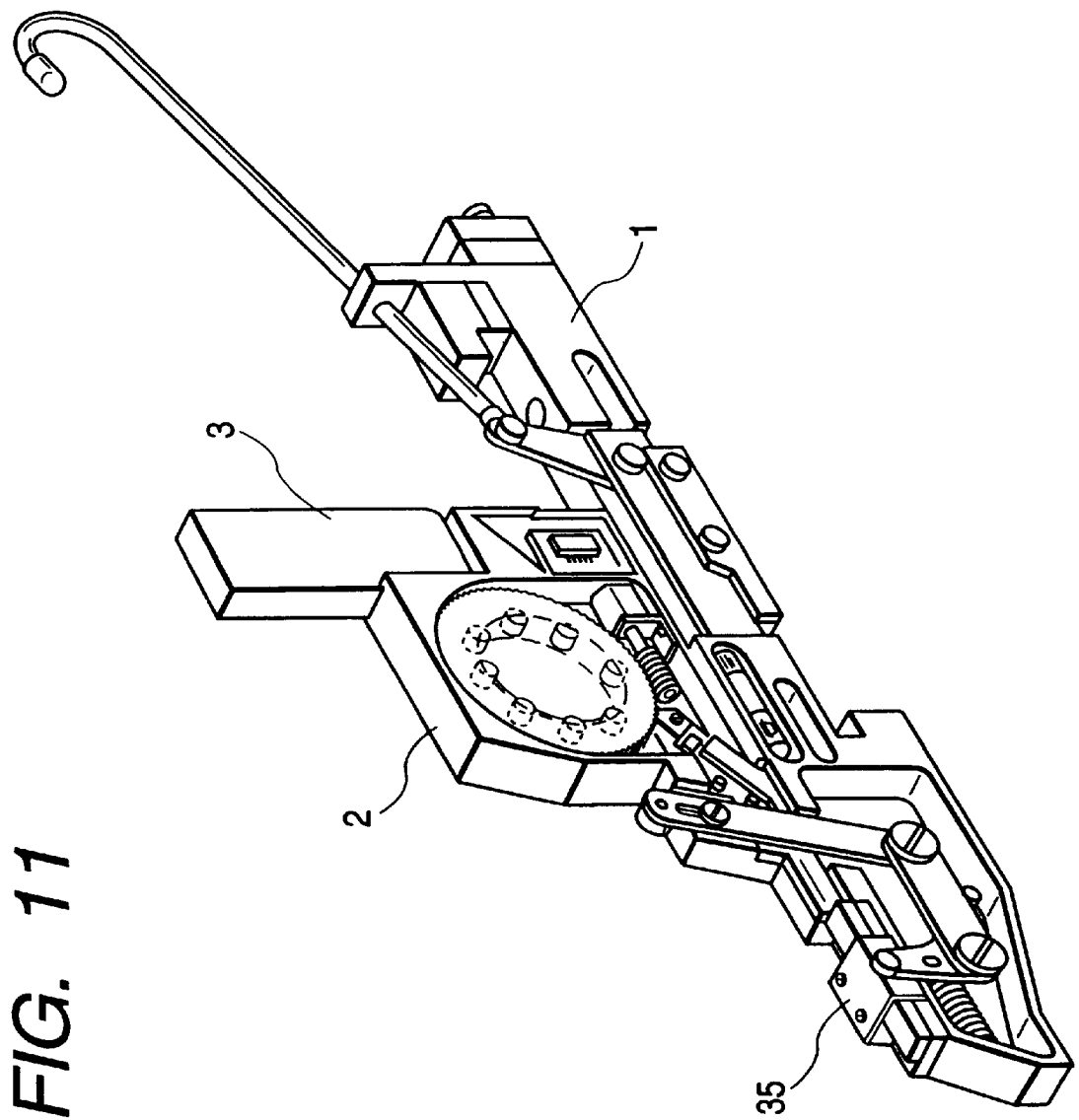
FIG. 11 is a perspective view which shows a parts feeder according to the second embodiment of the invention.

FIG. 11 shows a parts feeder according to the second embodiment of the invention. The same reference numbers as employed in the first embodiment refer to the same parts, and explanation thereof in detail will be omitted here.

The parts feeder of this embodiment includes a shutter 35. The shutter 35 mechanically slides right, as viewed in the drawing, to supply the parts, one by one, to the pickup station 17, as shown in FIG. 8, so that they can be picked up, in sequence, by the vacuum nozzle 18.

Figure 12:
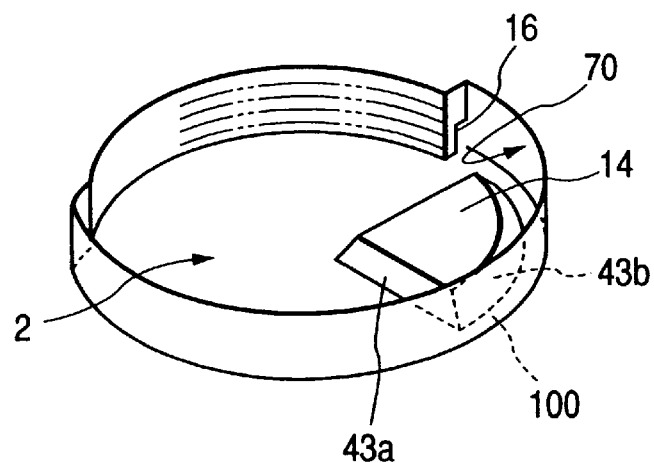
FIG. 12 is a perspective view which shows the inside of a parts orientation chamber.

FIG. 12 is a schematic representation which shows the parts orienting member 14 disposed within the parts orientation chamber 2. The parts orienting member 14 is illustrated as being separate from the parts orientation chamber 2 for the brevity of representation, but in practice, it is, like the first embodiment, formed integrally with the guide 15 (i.e., the parts orientation chamber 2), as shown in FIGS. 6 and 7.

The parts orienting member 14 has a straight side wall 43a and a half-round side wall 43b. The half-round side wall 43b defines the parts lining up path 100 between itself and the inner peripheral wall 70 of the parts orientation chamber 2. The parts lining up path 100 has, as discussed above, a radius of curvature substantially equal to that of the circular line along which the centers of the magnets 7 are arranged, so that the parts are transported smoothly into the transport path 16 by rotation of the magnets 7.

Figure 13:
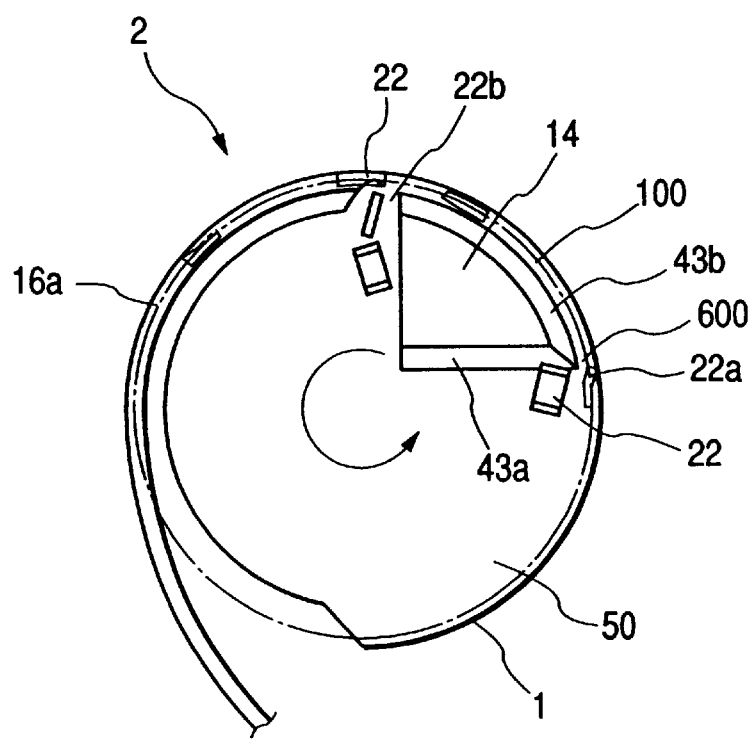
FIG. 13 is a side view which shows the inside of a parts orientation chamber.
Figure 14:
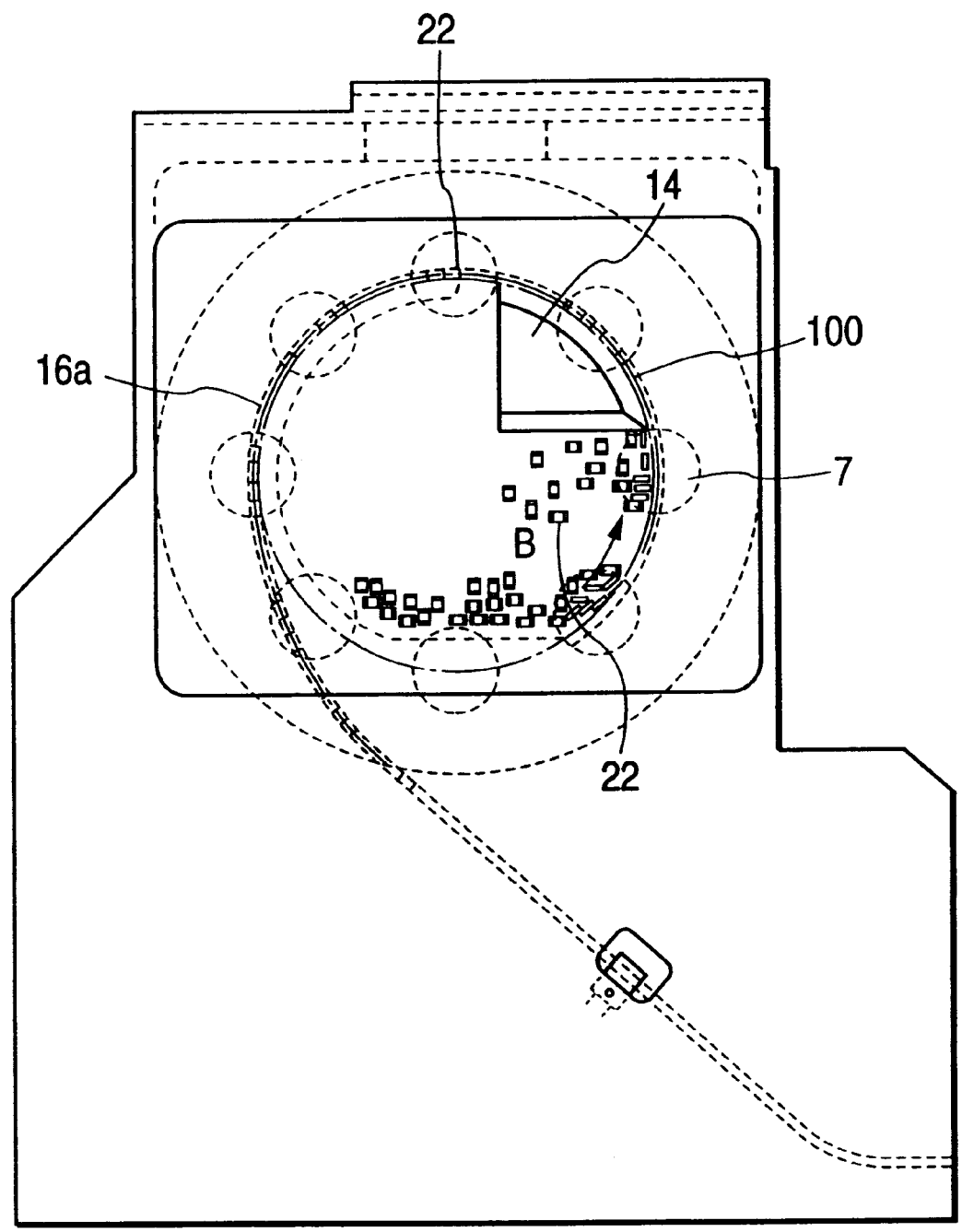
FIG. 14 is a partially side view which shows a parts orientation chamber and a transport path leading to a parts pickup station.

The straight side wall 43a and the half-round side wall 43b of the parts orienting member 14 are tapered to the cover 60. The parts lining up path 100 has at least at an inlet 600, as shown in FIG. 13, an open area which allows only the parts 22 whose length is oriented in a circumferential direction of the parts orientation chamber 2, that is, oriented in alignment with the parts lining up path 100 and whose length is oriented substantially perpendicular the parts lining up path 100 to enter the inlet 600. The latter parts are, however, as indicated at numeral 22b, dropped by the inlet 13 shown in FIG. 6 on the bottom of the parts orientation chamber 2 without entering the transport path 16. If the parts are oriented in directions other than the above when reaching the inlet 600, they will be urged by the tapered surface 43a away from the cover 50, so that the attraction of the parts to the magnets 7 is released, thereby causes the parts to drop, as indicated by B in FIG. 14, on the bottom of the parts orientation chamber 2.

The parts 22 each include, as already described with reference to FIG. 5, the C-shaped nickel electrode layers 48 formed on ends of the strip substrate 47 and the solder-plated layers 49 formed on the electrode layers 48. The nickel electrode layers 48 are attracted most strongly by the magnets 7. The possibility of the parts 22 being transported to the parts lining up path 100 with both the nickel electrode layers 48 attracted to one of the magnets 7, that is, the possibility of the parts 22 being transported in alignment with the parts lining up path 100 is, thus, high. When the parts 22 enter the transport path 16, they are, as discussed in the first embodiment, drawn to the pickup station 17 through the shutter 35.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A parts feeder feeding parts in sequence in a desired orientation comprising:

a base;

a parts storage disposed on said base, storing therein a plurality of parts;

a parts orientation chamber formed in said base, said parts orientation chamber having a parts inlet and a parts outlet, the parts inlet leading to said parts storage so that the parts within said parts storage are supplied to said parts orientation chamber through the parts inlet, the parts outlet being formed in an upper portion of said parts orientation chamber and leading to a parts pickup station through a transport path;

a parts lining up path extending from a lower portion of said orientation chamber to the parts outlet, said parts lining up path being designed to allow the parts oriented in a given direction to pass through said parts lining up path;

a parts lifting mechanism lifting the parts supplied to said orientation chamber through the parts inlet toward the parts outlet through said parts lining up path; and a guide member disposed within said parts orientation chamber, said guide member having a parts guiding surface which extends between an upper end of said parts lining up path leading to the parts outlet and the parts inlet for guiding the parts dropping from said parts lining up path without entering the parts outlet toward the parts inlet.

2. A parts feeder as set forth in claim 1, wherein the parts guiding surface of said guide member has a lower end located at a given interval away from the parts inlet.

3. A parts feeder as set forth in claim 2, wherein the given interval is greater than a length of the parts.

4. A parts feeder as set forth in claim 3, wherein said parts orientation chamber is a cylindrical chamber having an inner circumferential wall, and wherein the parts outlet is formed in an upper portion of the inner circumferential wall, and the parts inlet is formed in a lower portion of the inner circumferential wall.

5. A parts feeder as set forth in claim 4, wherein said parts lifting mechanism has a plurality of magnets arranged on a given circular line substantially coinciding with the inner circumferential wall of said parts orientation chamber, said parts lifting mechanism turning the magnets along the circular line to transport the parts magnetically toward the parts outlet along the inner circumferential wall through the parts lining up path.

6. A parts feeder as set forth in claim 5, wherein each of said magnets produces a magnetic force attracting one of the parts lying within a given range on the inner circumferential wall, and wherein the given interval between the lower end of the parts guiding surface of said parts guide member and the parts inlet falls within the given range.

7. A parts feeder as set forth in claim 5, wherein the magnets are each made of a magnetic disc having a preselected radius and arranged at centers thereof on the circular line.

8. A parts feeder as set forth in claim 7, wherein the given interval between the lower end of the parts guiding surface of said guide member and the parts inlet is smaller than the radius of the magnets.

9. A parts feeder as set forth in claim 5, wherein said parts lifting mechanism has a rotary disc having an end surface on which the magnets are arranged at regular intervals on the given circular line, the rotary disc being rotated to move the magnets along the given circular line so that each of the magnets may produce a magnetic force at least between the parts inlet and the lower end of the parts guiding surface of said guide member when each of the magnets travels near the parts inlet.

10. A parts feeder as set forth in claim 6, wherein the center of the given circular line on which the magnets are arranged is shifted upward from that of the inner circumferential wall of said parts orientation chamber for urging the parts magnetically against the inner circumferential wall as the parts advance upward.

11. A parts feeder as set forth in claim 1, wherein said parts guiding surface of said guide member is mirror finished.

12. A parts feeder as set forth in claim 11, wherein said parts guiding surface has an upper end connecting to an upper inner wall of said parts orientation chamber upstream of the parts outlet.

13. A parts feeder as set forth in claim 1, wherein a width of said guide member is substantially equal to a width of said parts orientation chamber.

14. A parts feeder as set forth in claim 1, further comprising a parts orienting member disposed between said guide member and an inner wall of said parts orientation chamber, said parts orienting member having a parts orienting surface to define the parts lining up path between the parts orienting surface and the inner wall of said parts orientation chamber.

15. A parts feeder as set forth in claim 14, wherein a lower end of said parts guiding surface of said guide member is located below said parts orienting member.

16. A parts feeder as set forth in claim 14, wherein said parts orienting member is formed integrally with said guide member.

17. A parts feeder as set forth in claim 1, wherein at least a lower end portion of said guide member is made of a strip member.

18. A parts feeder as set forth in claim 17, wherein the parts guiding surface of said guide member extends straight to the parts inlet.

19. A parts feeder as set forth in claim 1, wherein the parts outlet is made of a material harder than that of said parts orientation chamber.

20. A parts feeder as set forth in claim 1, wherein the transport path is greater in sectional area than the parts outlet.

21. A parts feeder as set forth in claim 5, wherein the transport path includes an upstream portion which leads to the parts outlet and which is curved along the given circular line on which the magnets are arranged.

22. A parts feeder as set forth in claim 21, wherein the upstream portion of the transport path extends downward from the parts outlet.

23. A parts feeder as set forth in claim 22, further comprising a parts drawing mechanism which draws the parts entering the parts outlet to the parts pickup station through the transport path.

24. A parts feeder as set forth in claim 23, further comprising a pickup nozzle which picks up one of the parts transported to the parts pickup station, and wherein said parts drawing mechanism stops drawing the parts when said pickup nozzle picks up one of the parts.

25. A parts feeder as set forth in claim 24, wherein the base has a given length, wherein the transport path extends in a lengthwise direction of said base to one end of said base, and wherein a parts drawing force is supplied from the other end of said base to said parts drawing mechanism.

26. A parts feeder as set forth in claim 25, wherein said parts drawing mechanism draws a vacuum from the transport path.

27. A parts feeder as set forth in claim 5, wherein said guide member is made of a non-magnetic material.

28. A parts feeder as set forth in claim 5, wherein said guide member is made of a non-magnetic conductive material.

29. A parts feeder feeding parts in sequence in a desired orientation comprising:
   a base;
   a parts orientation chamber defined in said base by a first side wall, a second side wall opposite the first side wall, a third side wall, a fourth side wall opposite the third side wall between the first and second side walls, an upper wall, and a lower wall, said parts orientation chamber having a parts inlet and a parts outlet, the parts outlet being formed in the upper wall of said parts orientation chamber and leading to a parts pickup station through a transport path;
   a parts lining up path defined within said parts orientation chamber which extends from at least the third side wall to the parts outlet so that the parts oriented in a given direction may pass through said parts lining up path;
   a parts lifting mechanism moving at least one magnet along a given travel path to attract and lift the parts supplied to said orientation chamber through the parts inlet upward from at least the lower wall to said parts lining path;

a parts orienting member disposed within said parts orientation chamber on the first side wall, said parts orienting member having a parts orienting side wall which defines said parts lining up path between itself and at least the third side wall and the upper wall of said parts orientation chamber; and an unoriented parts releasing mechanism provided at an inlet of said parts lining up path to release the parts unoriented in the given direction from attraction to the magnet of said parts lifting mechanism.

30. A parts feeder as set forth in claim 29, further comprising a guide member disposed within said parts orientation chamber, said guide member having a parts guiding surface which extends between an upper end of said parts lining up path and the parts inlet for guiding the parts dropping from said parts lining up path without entering the parts outlet toward the parts inlet.

31. A parts feeder as set forth in claim 29, wherein the lower wall and the third side wall are formed with a curved wall.

32. A parts feeder as set forth in claim 29, wherein said parts lifting mechanism has a plurality of magnets arranged on a given circular line partially coinciding with said parts lining up path, said parts lifting mechanism turning the magnets along the circular line to transport the parts magnetically toward the parts outlet through the parts lining up path.

33. A parts feeder as set forth in claim 32, wherein said parts lifting mechanism has a rotary disc having an end surface on which the magnets are arranged at regular intervals on the given circular line, the rotary disc being rotated to move the magnets along the given circular line.

34. A parts feeder as set forth in claim 29, wherein the parts orienting side wall of said parts orienting member is tapered away from the first side wall of said parts orientation chamber, and wherein said unoriented parts releasing mechanism is formed with a second side wall which continues from the parts orienting side wall of said parts orienting member and which is tapered away from the first side wall of said parts orientation chamber.

35. A parts feeder as set forth in claim 32, wherein the lower wall and the third side wall is formed with a wall curved along the circular line on which the magnets are arranged.

36. A parts feeder as set forth in claim 32, wherein the transport path includes an upstream portion which leads to the parts outlet and which is curved along the given circular line on which the magnets are arranged.

37. A parts feeder as set forth in claim 29, wherein the parts outlet is designed to prohibit entrance of the parts unoriented in the given direction.

* * * * *

UNITED STATES PATENT AND TRADEMARK OFFICE
CERTIFICATE OF CORRECTION

PATENT NO. : 6,202,890 B1
DATED : March 20, 2001
INVENTOR(S) : Manabu Morita, Takeshi Nishiguchi and Mikio Yasuda It is certified that error appears in the above-identified patent and that said Letters Patent is hereby corrected as shown below:

<u>Title page,</u>
The resident city of the second named inventor changed from "Sourku-gun" to
-- Souraku-gun --.

Signed and Sealed this

Sixteenth Day of October, 2001

Attest:

NICHOLAS P. GODICI
*Attesting Officer*     *Acting Director of the United States Patent and Trademark Office*